(12) United States Patent
Wang et al.

(10) Patent No.: US 12,164,104 B2
(45) Date of Patent: Dec. 10, 2024

(54) METHOD FOR DESIGNING MULTI-LAYER OPTICAL STRUCTURE AND ELECTRONIC DEVICE FOR PERFORMING THE SAME

(71) Applicants: Ningbo Inlight Technology Co., Ltd., Ningbo (CN); The Regents of the University of Michigan, Ann Arbor, MI (US)

(72) Inventors: Haozhu Wang, Ann Arbor, MI (US); Chengang Ji, Ningo (CN); Lingjie Jay Guo, Ann Arbor, MI (US)

(73) Assignees: Ningbo Inlight Technology Co., Ltd, Zhejiang (CN); The Regents of the University of Michigan, Ann Arbor, MI (US)

( * ) Notice: Subject to any disclaimer, the term of this patent is extended or adjusted under 35 U.S.C. 154(b) by 1041 days.

(21) Appl. No.: 17/112,556

(22) Filed: Dec. 4, 2020

(65) Prior Publication Data

US 2022/0179201 A1   Jun. 9, 2022

(51) Int. Cl.
*G02B 27/00* (2006.01)
*G06F 30/10* (2020.01)
*G06N 20/00* (2019.01)

(52) U.S. Cl.
CPC ......... *G02B 27/0012* (2013.01); *G06F 30/10* (2020.01); *G06N 20/00* (2019.01)

(58) Field of Classification Search
CPC ...... G02B 27/0012; G06N 20/00; G06F 30/10
See application file for complete search history.

(56) References Cited

U.S. PATENT DOCUMENTS

2020/0081245 A1* 3/2020 Deliwala ............... G06F 30/00

OTHER PUBLICATIONS

Heribert Wankerl et al.; "Parameterized Reinforcement Learning for Optical System Optimization"; workshop on machine learning for engineering modeling, simulation and design @ NeurIPS 2020 (Year: 2020).*

Anqing Jiang et al.; "Multilayer optical thin film design with deep Q learning"; Scientific Reports I (2020) 10:12780 (Year: 2020).*

(Continued)

*Primary Examiner* — Rehana Perveen
*Assistant Examiner* — Nupur Debnath
(74) *Attorney, Agent, or Firm* — Crowell & Moring LLP (57) ABSTRACT

A method for designing a multi-layer optical structure includes: obtaining candidate multi-layer optical structures through a sequence generator; obtaining a candidate spectrum for each candidate multi-layer optical structure; obtaining a difference between the candidate spectrum and a target spectrum; updating sequence generator parameters through reinforcement learning training and iteratively performing the obtainings and the updating in response to a first termination condition being not met; and selecting one of all obtained candidate structures to be a target multi-layer optical structure in response to the first termination condition being met. The difference between a spectrum of the target multi-layer optical structure and the target spectrum is minimized through the process. The method of the present application can perform the designs robustly and effectively.

16 Claims, 5 Drawing Sheets

(56) References Cited

OTHER PUBLICATIONS

Xin Wang et al.; "SkipNet: Learning Dynamic Routing in Convolutional Networks"; https://arxiv.org/pdf/1711.09485.pdf (Year: 2018).*
Chang Sun et al.; "Deep reinforcement learning for optical systems: A case study of mode-locked lasers"; Mach. Learn.: Sci. Technol. 1 (2020) 045013 (Year: 2020).*

* cited by examiner

METHOD FOR DESIGNING MULTI-LAYER OPTICAL STRUCTURE AND ELECTRONIC DEVICE FOR PERFORMING THE SAME

TECHNICAL FIELD

The present disclosure relates to the field of multi-layer optical structures, and in particular to a method for designing a multi-layer optical structure and an electronic device.

BACKGROUND

Multi-layer optical structures, such as multi-layer optical films, are widely used in optical and energy applications, such as broadband filtering, photovoltaics, radiative cooling, etc. The multi-layer optical structures are generally designed by researchers and engineers based on their physical intuition. However, a completely human-based design process is time-consuming and often leads to suboptimal designs, especially when the design space is enormous. On the other hand, computational methods for designing the optical structures are applied. However, the computational methods in the related art are performed based entirely on heuristic search. In this way, when the heuristics are not appropriate for a task, the design process (such as designing a particular optical structure) may also lead to suboptimal structures.

SUMMARY OF THE DISCLOSURE

According to a first aspect of the present disclosure, a method for designing a multi-layer optical structure is provided. The method includes: obtaining a plurality of candidate multi-layer optical structures through a neural network-based sequence generator, wherein each of the plurality of generated multi-layer structures has a candidate sequence of materials and a candidate thickness for each of the materials; obtaining the spectrum for each of the plurality of candidate multi-layer structures; obtaining a difference between the candidate spectrum and a target spectrum; determining whether a first termination condition being met; updating the sequence generator parameters through reinforcement learning training an iteratively performing the obtainings and the updating in response to the first termination condition being not met; and selecting one of all obtained candidate multi-layer optical structures to be a target multi-layer optical structure in response to the first termination condition being met, wherein the difference between a spectrum of the target multi-layer optical structure and the target spectrum is minimal.

According to a second aspect of the present disclosure, an electronic device is provided and includes a processor and a non-transitory memory. Computer programs are stored in the non-transitory memory, and the computer programs are executed by the processor to perform operations as described in the first aspect of the present disclosure.

DETAILED DESCRIPTION

Technical solutions of embodiments of the present disclosure may be illustrated by referring to the drawings of the embodiments of the present disclosure.

Figure 1:
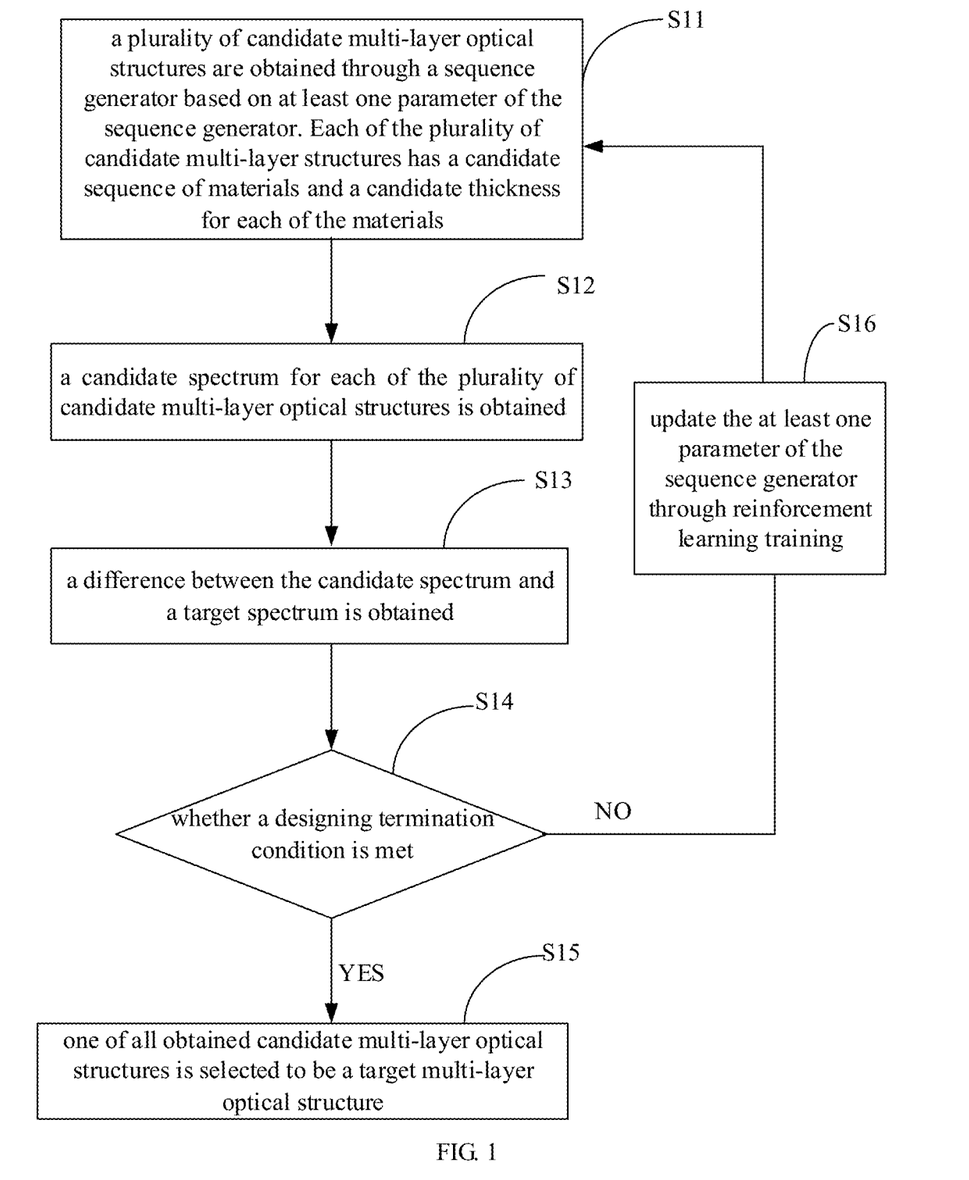
FIG. 1 is a flow chart of a method for designing a multi-layer optical structure according to an embodiment of the present disclosure.

FIG. 1 is a flow chart of a method for designing a multi-layer optical structure according to an embodiment of the present disclosure. The method includes following operations.

In an operation S11, a plurality of candidate multi-layer optical structures are obtained through a sequence generator. Each of the plurality of candidate multi-layer structures has a candidate sequence of materials and a candidate thickness for each of the materials.

In details, a sequence generation network may be taken as the sequence generator. The sequence generation network may include a first unit, a second unit, and a third unit. In the present embodiment, the first unit may be a gated recurrent unit (GRU), and the second unit and the third unit may be two multi-layer perceptrons (MLPs) respectively. The GRU is a variant of a recurrent neural network (RNN). RNNs are suitable for tasks that require memorizing history and have been widely used in sequence generation tasks.

Figure 2:
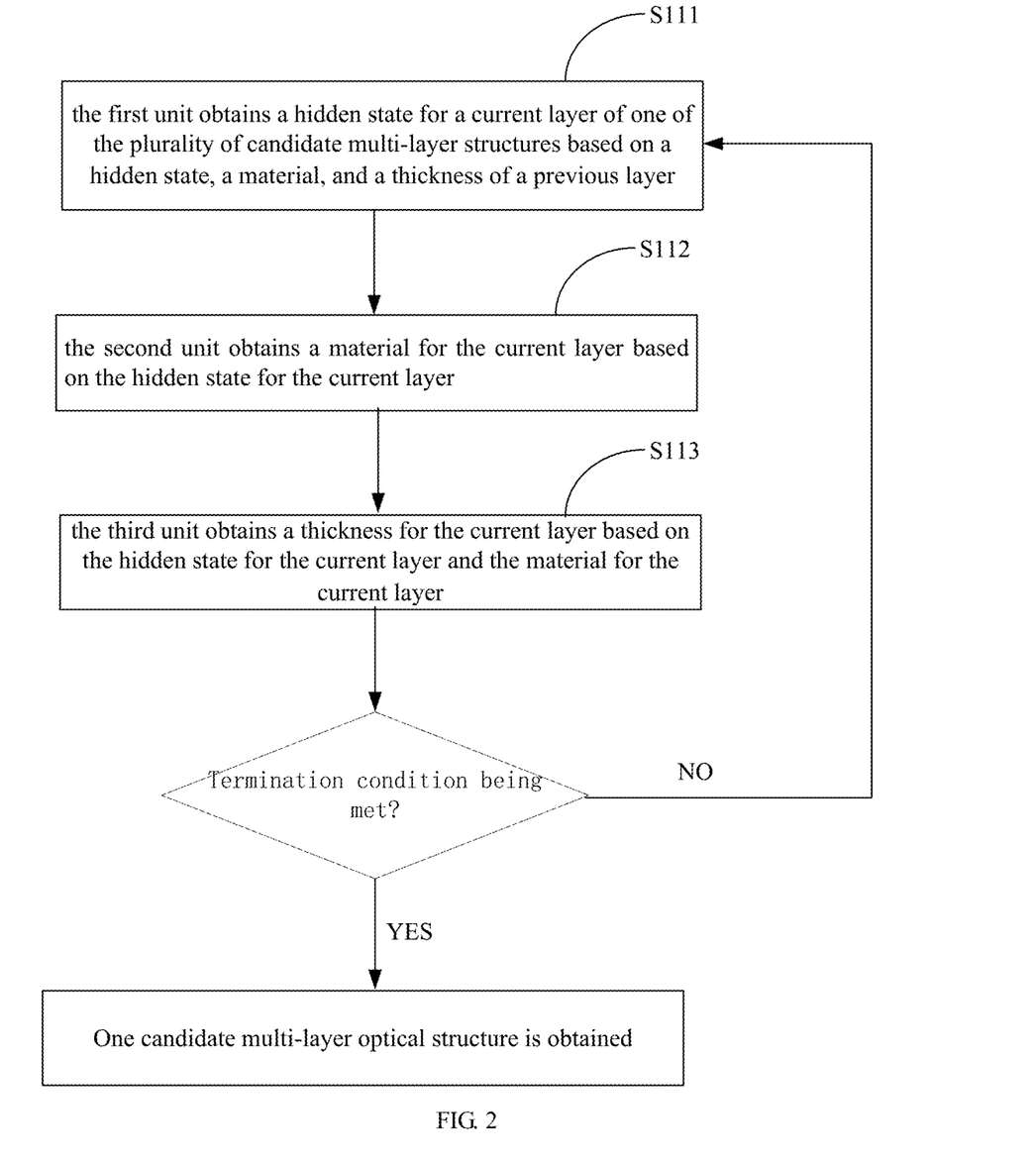
FIG. 2 is a flow chart of performing the operation S11 of the method for designing the multi-layer optical structure according to the embodiment shown in FIG. 1 of the present disclosure.

FIG. 2 is a flow chart of performing the operation S11 of the method for designing the multi-layer optical structure according to the embodiment shown in FIG. 1 of the present disclosure. In details, the operation S11 includes following operations.

In an operation S111, the first unit obtains a hidden state for the current layer of one of the plurality of candidate multi-layer structures based on the hidden state, the material, and the thickness of the previous layer.

The multi-layer optical structure includes a plurality of layers. A layer l is represented as $s_l=(m_l, d_l)$, the $m_l$ represents the material of the layer l, and the $d_l$ represents the thickness of the layer l. A hidden state h carries useful information from layers generated before layer l. In a process of designing the current layer, the hidden state of the previous layer ($h_{l-1}$) and the layer information of the previous layer ($s_{l-1}$) may be inputted into the first unit, and the first unit may output the hidden state of the current layer ($h_l$). Similarly, in a process of obtaining a next layer, the hidden state of the current may be inputted into the first unit. In this way, the first unit may take its own output from a current generation process as an input for a following generation process. This auto-regressive generation process may allow the first unit to remember what has been generated so far.

In an operation S112, the second unit obtains a material for the current layer based on the hidden state for the current layer.

The hidden state $h_l$ of the current layer obtained by the first unit (from the operation S111) may be inputted to the second unit. The second unit may output material logit vectors $\sigma_{m_l} \in \mathbb{R}^{|A_l|+1}$ corresponding to all possible materials for the current layer. The material logit vectors may be transformed with a softmax function to obtain probability distributions of all possible materials for the current layer. Further, the material for the current layer may be obtained from all possible materials based on the probability distributions.

In an operation S113, the third unit obtains a thickness for the current layer based on the hidden state for the current layer and the material for the current layer.

A thickness of a layer may depend on the material of the layer. Therefore, in a process of obtaining the thickness, the material of the layer may be considered. In this way, the hidden state hi of the current layer obtained by the first unit (from the operation S111) and the material of the current layer (i.e., the material obtained from the operation S112) may be inputted to the third unit. The third unit may output thickness logit vectors $\sigma_{d_l} \in \mathbb{R}^{|D|}$ corresponding to all allowable thicknesses. The thickness logit vectors may be transformed with the softmax function to obtain probability distributions of all allowable thicknesses for the current layer. Further, the thickness for the current layer may be obtained from all allowable thicknesses based on the probability distributions.

In the present embodiment, an auto-regressive generation of material and thickness may be performed. Instead of using a one-hot vector to represent the material, a material embedding matrix emb $\in \mathbb{R}^{|A_l| \times d}$ may be trained together with the sequence generator. Each row of the embedding matrix may be a continuous representation of one material, where d is the embedding size. Using an embedding may enable a large number of materials to be analyzed without significantly increasing the dimensionality of the material representation. The material embedding vector for the sampled material $emb_{m_l}$ may be concatenated with the hidden state hi to form the input $[emb_{m_l}, h_l]$ to the second unit.

Further, the operations S111-S113 may be repeatedly performed to obtain one of the plurality of candidate multi-layer optical structures until a termination condition being met.

In the process of obtaining each of the plurality of candidate multi-layer optical structures, the maximum number of layers for each of the plurality of candidate multi-layer optical structures may be predefined according to the user's requirement, such as 5 or 6, etc. In this way, the termination condition may be the maximum number of layers being reached. For example, when the maximum number of layers is set to be 6, the operations S111-S113 may be performed 6 times in maximum to obtain a candidate multi-layer optical structure with 6 layers of materials.

Alternatively, in the operation S112, after the hidden state of the current layer is inputted into the second unit, the second unit may output an end-of-sequence (EOS) token. In this situation, the termination condition may be the EOS token being obtained.

Further, the operation S112 includes removing the material of the previous layer from the plurality of materials of the current layer.

In details, two or more adjacent layers in a same material may be equivalent to a single thick layer. Therefore, to reduce redundant computation, a non-repetitive gating function may be introduced to the sequence generator to prevent the sequence generator from obtaining the same material for the adjacent layers.

The non-repetitive gating function may remove the logit element corresponding to the most recently sampled material to prevent the sequence generator from generating the same materials in a row. The gating function may be a matrix $I_{NR} \in \mathbb{R}^{(|A_l|-1) \times (|A_l|+1)}$ formed by removing the row corresponding to the most recently obtained material (i.e., the material for the previous layer) from an identity matrix. When multiplied with the logit vector $\sigma_{m_l}$, the element corresponding to the material will be removed, i.e., $\sigma_{m_l}' = I_{NR} \cdot \sigma_{m_l} \in \mathbb{R}^{|A_l|}$. Then, the transformed logit vector $\sigma'_{m_l}$ may be passed to the softmax layer to obtain a sampling probability. The sampling probability for the recurring material may be set to be 0. With the non-repetitive gating, the generated material sequence may obtain different materials for adjacent layers. It should be understood that the gating function may not be applied for generating the first layer of the candidate multi-layer optical structure, as no material may be obtained prior to the first layer.

In an operation S12, a candidate spectrum for each of the plurality of candidate multi-layer optical structures is obtained.

In an operation S13, a difference between the candidate spectrum and a target spectrum is obtained.

After each candidate multi-layer optical structure is obtained, the candidate multi-layer optical structure needs to be evaluated to determine whether the obtained candidate multi-layer optical structure meets a user's requirement. Therefore, a difference between a candidate spectrum of the obtained candidate multi-layer optical structure and a target spectrum may be obtained for the evaluation.

In an operation S14, it is determined whether a designing termination condition is met.

In response to the designing terminal condition being not met, the at least one parameter of the sequence generator may be updated through reinforcement learning training, and the operations S11-S13 may be reperformed with the updated at least one parameter as shown in the operation S16.

In response to the designing terminal condition being met, an operation S15 is performed. In the operation S15, one of all obtained candidate multi-layer optical structures may be selected to be a target multi-layer optical structure. The difference between a spectrum of the target multi-layer optical structure and the target spectrum may be minimal.

The number of times for reperforming the operations S11-S13 and updating the at least one parameter is predefined. The designing termination condition may be the number of times for reperforming being reached or a difference between a candidate spectrum of one of the obtained plurality of candidate multi-layer optical structures and the target spectrum being less than a predefined threshold.

In details, a gradient may be obtained for updating the at least one parameter through a proximal policy optimization (PPO) algorithm. The reinforcement learning training may be performed based on a reward value of each of the plurality of candidate multi-layer optical structures, and the reward value may be obtained by subtracting the difference between the candidate spectrum and the target spectrum from 1.

The hidden state of the l-th layer is represented to be concatenation of the last layer information and the GRU hidden state, i.e., $s_l = [(m_{l-1}, d_{l-1}), h_l]$. An action $a_l$ for generating the l-th layer may correspond to the material and thickness ($m_l$, $d_l$) of the l-th layer. Reward values for all layers, except the final layer, may be set to be 0. After obtaining the last layer, the candidate multi-layer optical structure may be obtained. The candidate spectrum of the obtained structure with an optical spectrum calculation package TMM may be obtained, and the reward value for the entire structure may be assigned based on how well the structure spectrum matches with the target spectrum. The reward value G for the obtained optical structure S may be simply the reward value at the final step, which may be defined as 1 minus a mean absolute error between the candidate spectrum of the obtained candidate optical structure and the target spectrum:

$$G(\mathcal{S}) = 1 - \frac{1}{K}\sum_{k=0} \frac{1}{J}\sum_{j=0}^{J-1} |T^S(\lambda_j, \delta_k) - \tilde{T}(\lambda_j, \delta_k)| \quad (1)$$

In the equation (1), $T^S(\lambda_j, \delta_k)$ is the candidate spectrum of the obtained optical structure S at the wavelength $\lambda_j$ under the incidence angle $\delta_k$. As $T \in [0, 1]$, the reward value may always be non-negative. The reward value may increase as the spectrum $T^S$ gets closer to the target spectrum $\tilde{T}$ until it reaches 1 where the candidate spectrum of the obtained candidate optical structure perfectly matches with the target spectrum.

In a process of the reinforcement learning training, the sequence generator $\pi_\theta$ may actively obtain the plurality of candidate multi-layer optical structures and receive reward values for the plurality of candidate multi-layer optical structures. A following equation (2) may be performed to maximize expected reward values for the candidate structures.

$$J(\theta) = \mathbb{E}_{\mathcal{S} \sim \pi_\theta}[G(\mathcal{S})] \quad (2)$$

Based on the calculated reward values for the obtained candidate optical structures, the parameter $\theta$ may be adjusted with gradient ascent such that future reward values may be improved. Here, the policy gradient algorithm may be taken to compute the gradient $\nabla_\theta J(\theta)$ for updating the sequence generator $\pi_\theta$. From the policy gradient theorem, a following equation (3) may be introduced.

$$g = \nabla_\theta J(\theta) = \mathbb{E}_{\mathcal{S} \sim \pi_\theta}[A(\mathcal{S})\nabla_\theta \log P_\theta(\mathcal{S})] \quad (3)$$

In the equation (3), the $P_\theta(\mathcal{S})$ is represented in the following, and is the probability of obtaining a candidate optical structure S from the sequence generator $\pi_\theta$. A(S) is an estimated advantage function, which measures performance of the candidate optical structure S compared against the average performance of the candidate optical structures obtained from the sequence generator $\pi_\theta$.

$$P_\theta(\mathcal{S}) = \Pi_{l=0}^{N-1} p_\theta(m_l|s_{l-1}, h_{l-1}) \cdot p_\theta(d_l|m_l, s_{l-1}, h_{l-1})$$

Instead of directly updating the sequence generator using the equation (3), the PPO may be taken to compute the policy gradient from a surrogate objective function, shown as a following equation (4).

$$g = \nabla_\theta \mathbb{E}_{\mathcal{S} \sim \pi_\theta}[\min(r(\theta)A_{\theta_v}(\mathcal{S}), \text{clip}(r(\theta), 1-\epsilon, 1+\epsilon)A_{\theta_v}(\mathcal{S}))] \quad (4)$$

In the equation (4), the $r(\theta)$ measures an importance weight indicating the distance between the policies before and after the gradient update. The clip function disincentivizes large update steps to the policy, where $\epsilon$ is a hyperparameter that affects the actual update size. The advantage $A_{\theta_v}$ may be estimated by Generalized Advantage Estimation (GAE), which achieves a good balance between bias and variance of the estimated gradients. $\theta_v$ is a model parameter for a critic network that may be trained together with the sequence generator. Compared to the vanilla policy gradient and actor-critic algorithms, the PPO may be more efficient as it allows multi-step updates using a same batch of trajectories.

Further, the operation S14 of the method for designing the multi-layer optical structure may further include an operation S141, the selected candidate multi-layer optical structure may be fine-tuned to obtain the target multi-layer optical structure through a quasi-Newton method.

Performance Evaluation of the Method

Figure 3A:
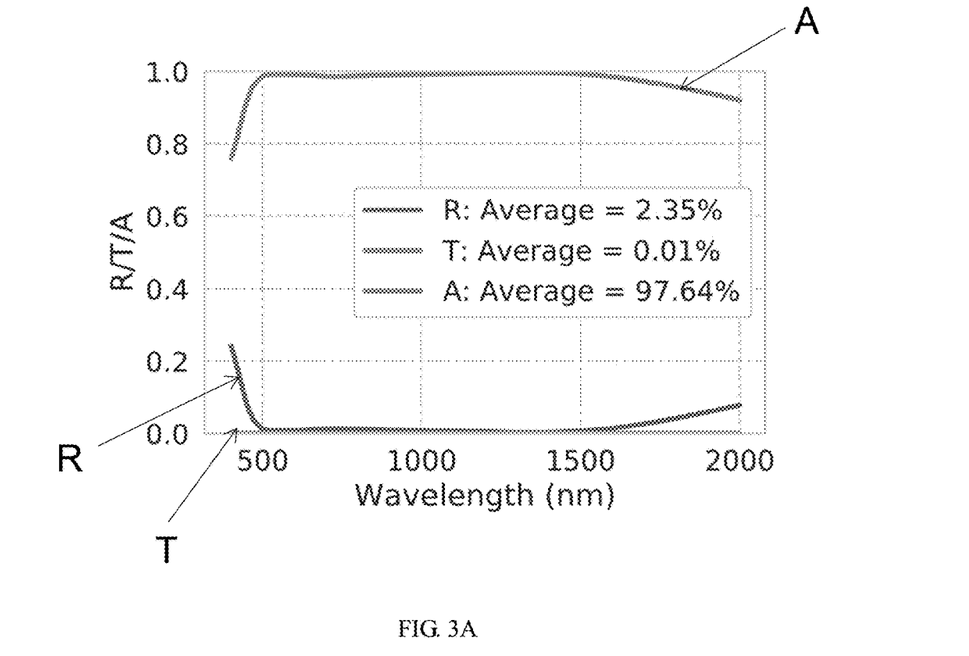
FIG. 3A shows normal incidence spectrum for a 5-layer optical structure obtained by performing the method for designing the multi-layer optical structure according to an embodiment of the present disclosure.

In one embodiment, an ultra-wideband absorber for the wavelength range of 400 nm-2000 nm is to be designed. The target spectrum may be set to be a constant 100% absorption under normal light incidence angle (i.e., the light is shining at the absorber at a right angle) to represent an ideal broadband absorber. All possible materials may include: Ag, Ni, Al, Si, $Al_2O_3$, $SiO_2$, Cr, Ti, $Fe_2O_3$, $TiO_2$, Ge, ZnO, $HfO_2$, ZnS, $MgF_2$, ZnSe. All allowable thicknesses may include: 15 nm, 20 nm, 25 nm, . . . , 200 nm, with a total of 38 different and discrete values. When training the sequence generator, a learning rate may be set to $5 \times 10^{-5}$ and the maximum length may be set to L=6 (the maximum number of layers is 6). A material embedding size d may be set to 5. The sequence generator may be trained for a total of 3000 epochs (the number of times for reperforming the operations S11-S13 is 3000 times) with the batch size set to be 1000 (the number of times for reperforming the operations S111-S113 is 1000 times). The training may be repeatedly performed for 10 runs with different random seeds. The best candidate optical structure, which may have the candidate spectrum closest to the target spectrum, may be selected in each run, recorded, and fine-tuned through the quasi-Newton method. The best selected candidate optical structure obtained by performing the above may be {(SiO2, 115 nm), (Fe2O3, 70 nm), (Ti, 15 nm), (MgF2, 124 nm), (Ti, 148 nm)}, exhibiting an average absorption of 97.64%. The spectrum under normal incidence is plotted and shown in FIG. 3A.

Figure 4A:
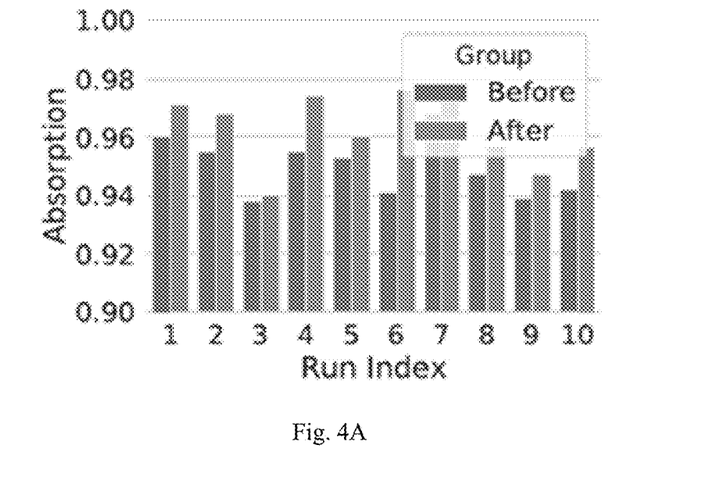
FIG. 4A shows absorption values of a candidate optical structure before and after the operation of fine-tuning according to an embodiment of the present disclosure.
Figure 4B:
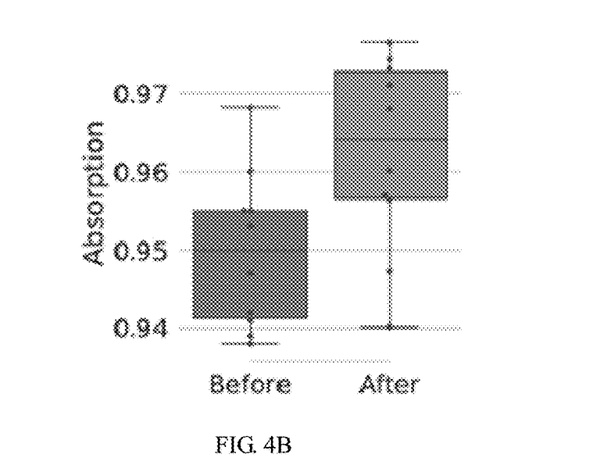
FIG. 4B shows boxplots for ten average absorption values of the candidate optical structure before and after the operation of fine-tuning according to the embodiment shown in FIG. 4A.

Further, the best absorption values before and after the fine-tuning operation of all ten runs are shown in FIG. 4. After fine-tuning, the average absorptions for the selected candidate optical structures across all runs may be improved. Further, the algorithm may be robust to the randomness during training as 8 out of the 10 runs achieved an absorption that is higher than 95% after the fine-tuning operation.

Figure 3B:
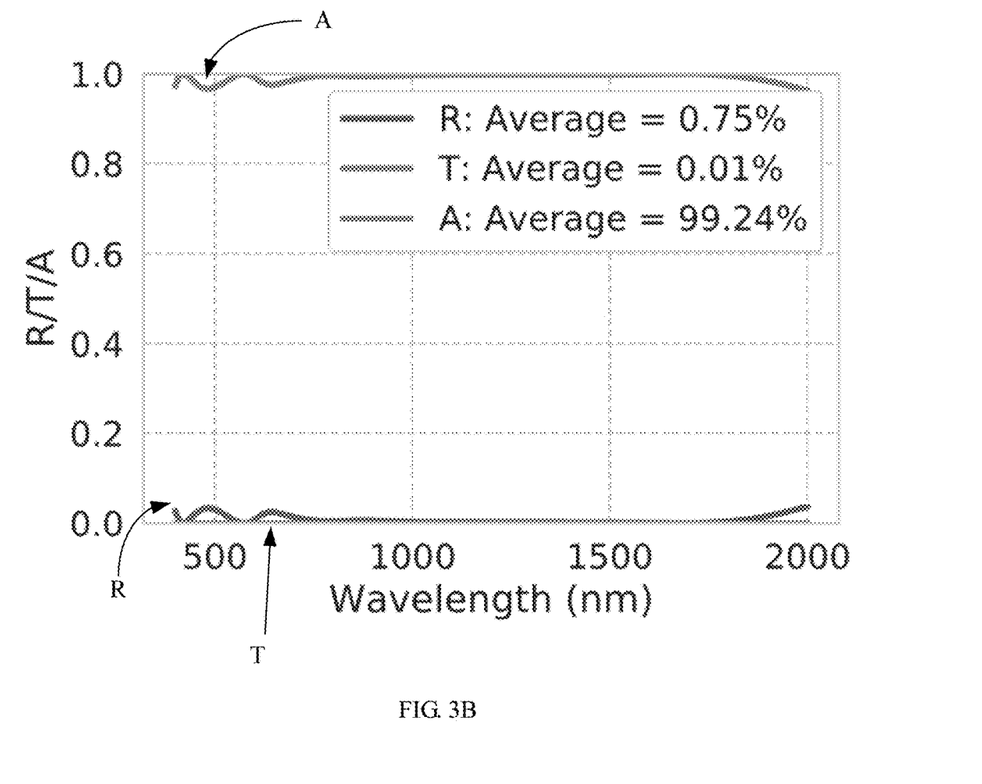
FIG. 3B shows normal incidence spectrum for a 14-layer optical structure obtained by performing the method for designing the multi-layer optical structure according to an embodiment of the present disclosure.

In another embodiment, the method may be performed to determine whether another candidate optical structure can be designed to achieve even higher absorptions. The maximum number of layers may be set to be L=14. All possible materials may include $MgF_2$, $TiO_2$, Si, Ge, and Cr. In the present embodiment, one of the candidate optical structures may have 14 layers with an average spectrum absorption of 99.24%. The normal incidence spectrum is plotted and shown in FIG. 3B. The candidate optical structure obtained by OML-PPO may reach close-to-perfect performance under normal incidence and may have high absorption over a wide range of angles.

In order to understand the effect of non-repetitive gating function and the auto-regressive generation of materials and thicknesses, four models may be trained. The four models are: OML-PPO with both non-repetitive gating function and the auto-regressive generation; the non-repetitive gating function only; the auto-regressive generation only; and a baseline model with neither the non-repetitive gating function nor the auto-regressive generation.

The training may be repeatedly performed for ten times on each model. Maximum absorption values obtained by each model before the fine-tuning are reported in a following table 1.

TABLE 1

| Model | Average Absorption |
| --- | --- |
| OML-PPO | 94.98% ± 0.99% |
| Only gating | 94.05% ± 1.39% |
| Only auto-regressive | 91.55% ± 1.14% |
| None (baseline) | 91.03% ± 0.87% |

Figure 5:
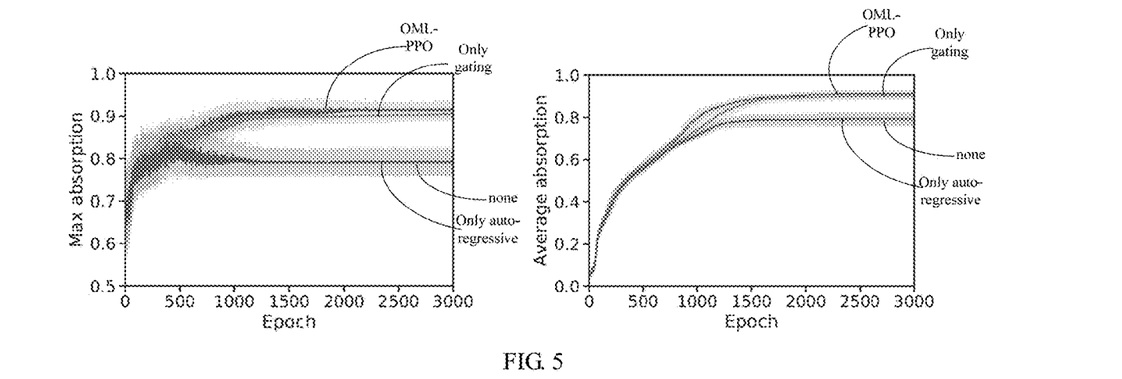
FIG. 5 shows comparison of training trajectory of the method according to an embodiment of the present disclosure and other baseline methods.

Both non-repetitive gating and the auto-regressive material/thickness generation improve the performance of the baseline model. The average absorption and maximum absorption of the obtained candidate optical structures generated in each epoch over the entire training trajectory are plotted and shown in FIG. 5. The effect of non-repetitive gating function may be more significant than the auto-regressive material/thickness generation. As the OML-PPO and the non-repetitive gating function only model both significantly outperform the other two models, the non-repetitive gating may significantly improve the model convergence during training. When the non-repetitive gating function model and the auto-regressive generation model are combined together, the model may achieve the best performance.

In still another embodiment, an incandescent light bulb filter, which may have an enhanced luminous efficiency, is to be designed. Infrared light emitted by the light bulb filament may be reflected so that light energy can be recycled. Therefore, the target reflectivity may be set to be 0% in a wavelength range of 480 nm-700 nm, and 100% in a wavelength range out of 480 nm-700 nm. All possible materials for a candidate optical structure may include $Al_2O_3$, $HfO_2$, $MgF_2$, SiC, $SiO_2$, and $TiO_2$. The other parameters for performing the method may refer to the above embodiment. The best obtained candidate optical structures are listed in a following table 2.

TABLE 2

| ID | Material | Thickness |
| --- | --- | --- |
| 1 | $SiO_2$ | 289 nm |
| 2 | SiN | 268 nm |
| 3 | $MgF_2$ | 185 nm |
| 4 | SiN | 189 nm |
| 5 | SiC | 214 nm |
| 6 | SiN | 214 nm |
| 7 | $MgF_2$ | 210 nm |
| 8 | SiN | 206 nm |
| 9 | SiC | 205 nm |
| 10 | SiN | 183 nm |
| 11 | $MgF_2$ | 184 nm |
| 12 | SiN | 179 nm |
| 13 | SiC | 203 nm |
| 14 | SiN | 273 nm |
| 15 | SiC | 210 nm |
| 16 | SiN | 168 nm |
| 17 | $MgF_2$ | 200 nm |
| 18 | SiC | 227 nm |
| 19 | SiN | 242 nm |
| 20 | $MgF_2$ | 222 nm |
| 21 | SiC | 228 nm |
| 22 | $MgF_2$ | 216 nm |
| 23 | SiC | 229 nm |
| 24 | $MgF_2$ | 203 nm |
| 25 | SiC | 101 nm |
| 26 | $MgF_2$ | 209 nm |
| 27 | SiC | 121 nm |
| 28 | $MgF_2$ | 225 nm |
| 29 | SiC | 117 nm |
| 30 | $MgF_2$ | 224 nm |
| 31 | SiC | 122 nm |
| 32 | $MgF_2$ | 235 nm |
| 33 | SiC | 127 nm |
| 34 | $MgF_2$ | 230 nm |
| 35 | SiC | 234 nm |
| 36 | $MgF_2$ | 218 nm |
| 37 | SiC | 235 nm |
| 38 | $MgF_2$ | 220 nm |
| 39 | SiC | 231 nm |
| 40 | $MgF_2$ | 216 nm |
| 41 | SiC | 233 nm |
| 42 | $Al_2O_3$ | 95 nm |

Average reflectivity normalized over all incidence angles (0-90 degree) of the obtained candidate 42-layer optical structures may be compared to a 41-layer optical structure designed by a memetic algorithm. The candidate optical structure obtained in the present embodiment may have a higher average reflectivity in the infrared range (>780 nm) than the 41-layer optical structure. Further, the performance of the optical structure obtained in the present embodiment may be quantitatively evaluated by calculating an enhancement factor for visible light (400 nm-780 nm) under a fixed operating power. The enhancement factor of the optical structure obtained in the present embodiment is 16.60, and the enhancement factor of the optical structure obtained by performing the memetic algorithm is 15.30.

According to the present disclosure, a multi-layer optical structure may be treated as sequences. Designing the multi-layer optical structure may be equivalent to a sequence generation problem. In the present disclosure, a sequence generator may be established. Further, a deep reinforcement learning pipeline may be established to automatically design candidate multi-layer optical structures with the optimal number of layers. According to the above embodiments, the method provided herein may achieve high performance robustly. The method may design an optical structure with optimal number of layers exhibiting better absorption (or even close-to-perfect absorption) than products designed by human experts.

Further, by comparing the four models in the above embodiment, the sequence generator provided in the present disclosure may greatly improve the optimization performance. The above embodiment shows that the high performance of the method on complicated optical design tasks may be achieved. The method in the present disclosure does not rely on hand-crafted heuristics, and therefore, the method may further be applied to many other multilayer optical design tasks, such as designing lenses and multi-layer meta-surfaces.

Figure 6:
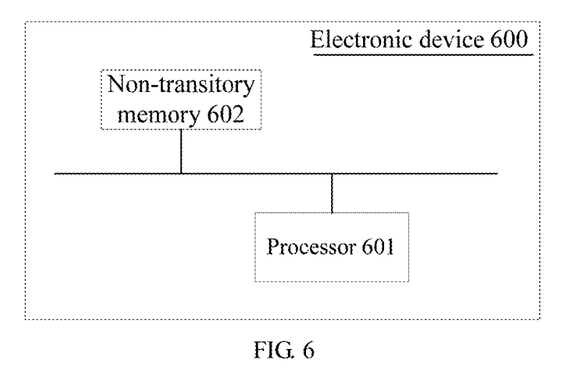
FIG. 6 is a diagram of an electronic device for performing the method for a multi-layer optical structure according to an embodiment of the present disclosure.

FIG. 6 is a diagram of an electronic device for performing the method for designing a multi-layer optical structure according to an embodiment of the present disclosure.

The electronic device 600 includes a non-transitory memory 602 and a processor 601, and a computer program is stored in the non-transitory memory 602. The computer program may be run by the processor 601 of the electronic device to enable the electronic device to perform the method for designing a multi-layer optical structure as described in the above embodiments, which will not be repeatedly described hereinafter.

The non-transitory memory 602 may be arranged to store software programs and modules. The processor 601 may be arranged to run the computer program and the modules stored in the non-transitory memory 602 to execute various functional applications and perform data processing. The non-transitory memory 602 may substantially include a program storage area and a data storage area. The program storage area may be arranged to store an operating system, at least one computer program necessary for functioning (such as for audio playing, image displaying, and the like). The data storage area may be arranged to store data generated during electronic device running and the like. In addition, the non-transitory memory 602 may include a high-speed random access memory and non-volatile memory, such as at least one magnetic disc, a flash memory, or other non-volatile solid state storage device. Accordingly, the non-transitory memory 602 may further include a memory controller to provide access of the non-transitory memory 602 to the processor 601.

Technical features of the above-mentioned embodiments may be combined arbitrarily. In order to provide a concise description, not all potential combinations of various technical features of the embodiments are described. However, the combinations of the various technical features should be within the scope of the present disclosure, with the proviso of the combinations of the various technical features having no conflicts.

The above description provides various implementations of the present disclosure, and the implementations are described specifically and in details, but this should not be deemed as limitation to the scope of the present disclosure. To be noted that, to any one of skill in the art, without departing from the concept of the present disclosure, various deformations and improvements may be performed and should be within the scope of the present disclosure. Therefore, the scope of the present disclosure will be defined by the claims of the present disclosure.

What is claimed is:

1. A method for designing a multi-layer optical structure, comprising:
   obtaining a plurality of candidate multi-layer optical structures through a sequence generator based on at least one parameter of the sequence generator, wherein each of the plurality of candidate multi-layer optical structures has a candidate sequence of materials and a candidate thickness for each of the materials;
   obtaining a candidate spectrum for each of the plurality of candidate multi-layer optical structures;
   obtaining a difference between the candidate spectrum and a target spectrum;
   determining whether a first termination condition being met;
   updating the at least one parameter of the sequence generator through reinforcement learning training and reperforming the obtainings and the updating if the first termination condition is not met; and
   selecting one candidate multi-layer optical structure whose spectrum has a minimal difference from the target spectrum among all obtained candidate multi-layer optical structures to be a target multi-layer optical structure if the first termination condition is met; and
   wherein the sequence generator comprises a first unit, a second unit, and a third unit; and
   the obtaining a plurality of candidate multi-layer optical structures through a sequence generator based on at least one parameter of the sequence generator, comprises:
   obtaining, by the first unit, a hidden state for a current layer of one of the plurality of candidate multi-layer optical structures based on a hidden state, a material, and a thickness of a previous layer;
   obtaining, by the second unit, a material for the current layer based on the hidden state for the current layer;
   obtaining, by the third unit, a thickness for the current layer based on the hidden state for the current layer and the material for the current layer;
   reperforming the obtainings to obtain the one of the plurality of candidate multi-layer optical structures until a second termination condition being met; and
   the obtaining, by the second unit, a material for the current layer based on the hidden state for the current layer, comprises: removing a material of the previous layer from a plurality of materials of the current layer; and
   the removing a material of the previous layer from the plurality of materials of the current layer, comprises:
   obtaining, by the second unit, probability distributions of a plurality of materials for the current layer based on the hidden state for the current layer;
   multiplying the probability distributions by a non-repetitive gating function, which sets a probability of the material for the previous layer to be 0;
   selecting a material from the remaining of the plurality of materials to be the material for the current layer.

2. The method according to claim 1, wherein
   the number of times for reperforming the obtainings and the updating is predefined; and
   the first termination condition is the number of times being reached or a difference between a candidate spectrum of one of the obtained plurality of candidate multi-layer optical structures and the target spectrum being less than a predefined threshold.

3. The method according to claim 1, wherein the obtaining, by the second unit, a material for the current layer based on the hidden state for the current layer, comprises:
   obtaining probability distributions of a plurality of materials for the current layer of one of the plurality of candidate multi-layer optical structures; and
   obtaining the material for the current layer based on the probability distributions of the plurality of materials.

4. The method according to claim 1, wherein the obtaining, by the third unit, a thickness for the current layer based on the hidden state for the current layer and the material for the current layer, comprises:
   obtaining probability distributions of a plurality of thicknesses for the current layer of one of the plurality of candidate multi-layer optical structures; and
   obtaining the thickness for the current layer based on the probability distributions of the plurality of thicknesses.

5. The method according to claim 1, wherein
   the number of layers for each of the plurality of candidate multi-layer optical structures is predefined; and
   the second termination condition is the number of layers being reached, or an end-of-sequence (EOS) token being obtained by the second unit.

6. The method according to claim 1, wherein the updating the at least one parameter of the sequence generator through reinforcement learning training, comprises:
   obtaining a gradient for updating the at least one parameter through a proximal policy optimization (PPO) algorithm.

7. The method according to claim 1, wherein the reinforcement learning training is performed based on a reward value of each of the plurality of candidate multi-layer optical structures, and the reward value is obtained by subtracting the difference between the candidate spectrum and the target spectrum from 1.

8. The method according to claim 1, wherein the selecting one of all obtained candidate multi-layer optical structures to be a target multi-layer optical structure, comprises:
finetuning the selected candidate multi-layer optical structure to obtain the target multi-layer optical structure through a quasi-Newton method.

9. An electronic device, comprising a processor and a non-transitory memory, wherein computer programs are stored in the non-transitory memory, and the computer programs are executed by the processor to perform operations of:
obtaining a plurality of candidate multi-layer optical structures through a sequence generator based on at least one parameter of the sequence generator, wherein each of the plurality of candidate multi-layer optical structures has a candidate sequence of materials and a candidate thickness for each of the materials;
obtaining a candidate spectrum for each of the plurality of candidate multi-layer optical structures;
obtaining a difference between the candidate spectrum and a target spectrum;
determining whether a first termination condition being met;
updating the at least one parameter of the sequence generator through reinforcement learning training and reperforming the obtainings and the updating if the first termination condition is not met; and
selecting one candidate multi-layer optical structure whose spectrum has a minimal difference from the target spectrum among all obtained candidate multi-layer optical structures to be a target multi-layer optical structure if the first termination condition is met;
wherein the sequence generator comprises a first unit, a second unit, and a third unit; and
when obtaining a plurality of candidate multi-layer optical structures through a sequence generator based on at least one parameter of the sequence generator, the computer programs are further executed by the processor to perform operations of:
obtaining, by the first unit, a hidden state for a current layer of one of the plurality of candidate multi-layer optical structures based on a hidden state, a material, and a thickness of a previous layer;
obtaining, by the second unit, a material for the current layer based on the hidden state for the current layer;
obtaining, by the third unit, a thickness for the current layer based on the hidden state for the current layer and the material for the current layer;
reperforming the obtainings to obtain the one of the plurality of candidate multi-layer optical structures until a second termination condition being met; and
when obtaining, by the second unit, a material for the current layer based on the hidden state for the current layer, the computer programs are further executed by the processor to perform and operation of: removing a material of the previous layer from the plurality of materials of the current layer; and
the operation of removing a material of the previous layer from the plurality of materials of the current layer, comprises:
obtaining, by the second unit, probability distributions of a plurality of materials for the current layer based on the hidden state for the current layer;
multiplying the probability distributions by a non-repetitive gating function, which sets a probability of the material for the previous layer to be 0;
selecting a material from the remaining of the plurality of materials to be the material for the current layer.

10. The electronic device according to claim 9, wherein the number of times for reperforming the obtainings and the updating is predefined; and
the first termination condition is the number of times being reached or a difference between a candidate spectrum of one of the obtained plurality of candidate multi-layer optical structures and the target spectrum being less than a predefined threshold.

11. The electronic device according to claim 9, wherein when obtaining, by the second unit, a material for the current layer based on the hidden state for the current layer, the computer programs are further executed by the processor to perform operations of:
obtaining probability distributions of a plurality of materials for the current layer of one of the plurality of candidate multi-layer optical structures; and
obtaining the material for the current layer based on the probability distributions of the plurality of materials.

12. The electronic device according to claim 1, wherein when obtaining, by the third unit, a thickness for the current layer based on the hidden state for the current layer and the material for the current layer, the computer programs are further executed by the processor to perform operations of:
obtaining probability distributions of a plurality of thicknesses for the current layer of one of the plurality of candidate multi-layer optical structures; and
obtaining the thickness for the current layer based on the probability distributions of the plurality of thicknesses.

13. The electronic device according to claim 9, wherein the number of layers for each of the plurality of candidate multi-layer optical structures is predefined; and
the second termination condition is the number of layers being reached, or an end-of-sequence (EOS) token being obtained by the second unit.

14. The electronic device according to claim 9, wherein when updating the at least one parameter of the sequence generator through reinforcement learning training, the computer programs are further executed by the processor to perform operations of:
obtaining a gradient for updating the at least one parameter through a proximal policy optimization (PPO) algorithm.

15. The electronic device according to claim 9, wherein the reinforcement learning training is performed based on a reward value of each of the plurality of candidate multi-layer optical structures, and the reward value is obtained by subtracting the difference between the candidate spectrum and the target spectrum from 1.

16. The electronic device according to claim 9, wherein when selecting one of all obtained candidate multi-layer optical structures to be a target multi-layer optical structure, the computer programs are further executed by the processor to perform operations of:
finetuning the selected candidate multi-layer optical structure to obtain the target multi-layer optical structure through a quasi-Newton method.

\* \* \* \* \*